(12) United States Patent
Balchandani et al.

(10) Patent No.: US 7,821,263 B2
(45) Date of Patent: Oct. 26, 2010

(54) SELF-REFOCUSED SPATIAL-SPECTRAL PULSE

(75) Inventors: Priti Balchandani, Menlo Park, CA (US); Daniel Spielman, Menlo Park, CA (US); John M. Pauly, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 293 days.

(21) Appl. No.: 12/136,319

(22) Filed: Jun. 10, 2008

(65) Prior Publication Data

US 2009/0315558 A1  Dec. 24, 2009

(51) Int. Cl.
 *G01V 3/00* (2006.01)
(52) U.S. Cl. ...................... 324/307; 324/309
(58) Field of Classification Search .......... 324/307, 324/309
See application file for complete search history.

(56) References Cited

U.S. PATENT DOCUMENTS

| | | | | |
|---|---|---|---|---|
| 6,175,236 | B1 * | 1/2001 | Zhou et al. | 324/307 |
| 6,304,084 | B1 * | 10/2001 | Star-Lack et al. | 324/307 |
| 7,038,452 | B2 * | 5/2006 | Epstein et al. | 324/309 |
| 7,166,998 | B2 * | 1/2007 | Magland et al. | 324/307 |
| 7,425,828 | B2 * | 9/2008 | Garwood et al. | 324/310 |
| 7,436,175 | B2 * | 10/2008 | Epstein et al. | 324/300 |

OTHER PUBLICATIONS

Pauly et al., "Parameter relations for the Shinnar-Le Roux selective excitation pulse design algorithm," IEEE Trans Med Imaging, vol. 10, No. 1, pp. 53-65, 1991.
Cunningham et al., "Positive Contrast Magnetic Resonance Imaging of Cells Labeled with Magnetic Nanoparticles," Magnetic Resonance in Medicine, vol. 53, pp. 999-1005, 2005.
Mani et al., "GRadient echo Acquisition for Superparamagnetic particles with Positive contrast (GRASP): Sequence Characterization in Membrane and Glass Superparamagnetic Iron Oxide Phantoms at 1.5T and 3T," Magnetic Resonance in Medicine, vol. 55, pp. 126-135, 2006.
Heyn et al., "Detection Threshold of Single SPIO-Labeled Cells with FIESTA," Magnetic Resonance in Medicine, vol. 53, pp. 312-320, 2005.
Seppenwoolde et al., "Passive Tracking Exploiting Local Signal Conservation: The White Marker Phenomenon," Magnetic Resonance in Medicine, vol. 50, pp. 784-790, 2003.
Lim et al., "Short TE Phosphorus Spectroscopy Using a Spin-Echo Pulse," Magnetic Resonance in Medicine, vol. 32, pp. 98-103, 1994.

* cited by examiner

*Primary Examiner*—Louis M Arana
(74) *Attorney, Agent, or Firm*—Beyer Law Group LLP

(57) ABSTRACT

A method for frequency selective and slice selective magnetic resonance imaging (MRI) is provided. A $B_0$ field is applied. A self-refocused spatial-spectral (SPSP) RF pulse is applied. A readout of a portion of k-space for the excited slice is performed. A second self-refocused SPSP excitation RF pulse is applied, wherein the second self-refocused SPSP excitation has an 180° echo phase difference from the self-refocused SPSP excitation. A second readout of a portion of k-space for the excited slice was performed. A difference between the readout and the second readout was found. The previous steps were repeated until k-space has been filled for the excited slice. The previous steps were repeated for a plurality of slices.

19 Claims, 7 Drawing Sheets

US 7,821,263 B2

SELF-REFOCUSED SPATIAL-SPECTRAL PULSE

STATEMENT REGARDING FEDERALLY SPONSORED RESEARCH OR DEVELOPMENT

This invention was made with Government Support under contract RR09784 awarded by the National Institutes of Health. The Government has certain rights in this invention.

BACKGROUND OF THE INVENTION

This invention relates generally to magnetic resonance imaging (MRI), and more particularly the invention relates to self-refocused spatial-spectral RF pulses for MRI.

Magnetic resonance imaging (MRI) requires placing an object to be imaged in a static magnetic field ($B_0$), exciting nuclear spins within the object with a RF magnetic field ($B_1$), and then using a RF coil to detect signals emitted by the excited spins as they process within the static magnetic field ($B_0$). Through the application of frequency and phase-encoding magnetic field gradients prior to and during signal acquisition, detected signals can be spatially localized in three dimensions.

SUMMARY

The invention provides a method for frequency selective and slice selective magnetic resonance imaging (MRI). A $B_0$ field is applied. A self-refocused spatial-spectral (SPSP) RF pulse is applied. A readout of a portion of k-space for the excited slice is performed.

In another manifestation of the invention a method for frequency-selective and slice-selective magnetic resonance imaging (MRI) is provided. A $B_0$ field is applied. A self-refocused spatial-spectral (SPSP) RF pulse is applied. A readout of a portion of k-space for the excited slice is performed. A second self-refocused SPSP excitation RF pulse is applied, wherein the second self-refocused SPSP excitation has a 180° echo phase difference from the self-refocused SPSP excitation. A second readout of a portion of k-space for the excited slice is performed. A difference between the readout and the second readout is found. The previous steps are repeated until k-space has been filled for the excited slice. The previous steps are repeated for a plurality of slices.

In another manifestation of the invention, an apparatus for frequency-selective and slice-selective magnetic resonance imaging (MRI) is provided. A magnetic resonance imaging excitation and detection system is provided. A controller is electrically connected to the magnetic resonance imaging excitation and detection system and comprises a display, at least one processor, and computer readable media. The computer readable media comprises computer readable code for applying a $B_0$ field, computer readable code for applying a self-refocused spatial-spectral (SPSP) RF pulse, computer readable code performing a readout of a portion of k-space for the excited slice, computer readable code for generating an image from the readout, and computer readable code for displaying the image on the display.

The invention and objects and features thereof will be more readily apparent from the following detailed description and appended claims when taken with the drawings.

DETAILED DESCRIPTION OF ILLUSTRATIVE EMBODIMENTS

An embodiment of the invention provides self-refocused spatial-spectral (SPSP) pulse to enable slice-selective, short-echo-time, spin-echo imaging of off-resonant spins. Using a separate, phase-matched, SPSP 90° and 180° pulses to create a spin echo would lengthen the minimum echo time considerably and result in increased signal dephasing due to diffusional motion. A self-refocused SPSP pulse is essentially a phase-matched 90° SPSP pulse and 180° SPSP pulse combined into one pulse through a series of approximations, resulting in a considerably shorter echo time than possible with two separate pulses, where the echo has a linear phase. The simultaneous spatial and spectral selectivity allows the imaging of off-resonant spins while selecting a single slice. Furthermore, the high spatial bandwidth of the short duration subpulses results in reduced chemical-shift localization error, ensuring that the same slice is selected for all frequencies of interest. Thus, the self-refocused SPSP pulse is suitable for any application requiring spatial and spectral selectivity at short echo times. Slice-selective positive-contrast imaging of superparamagnetic iron-oxide (SPIO) nanoparticle-labeled cells is one such application.

Figure 1:
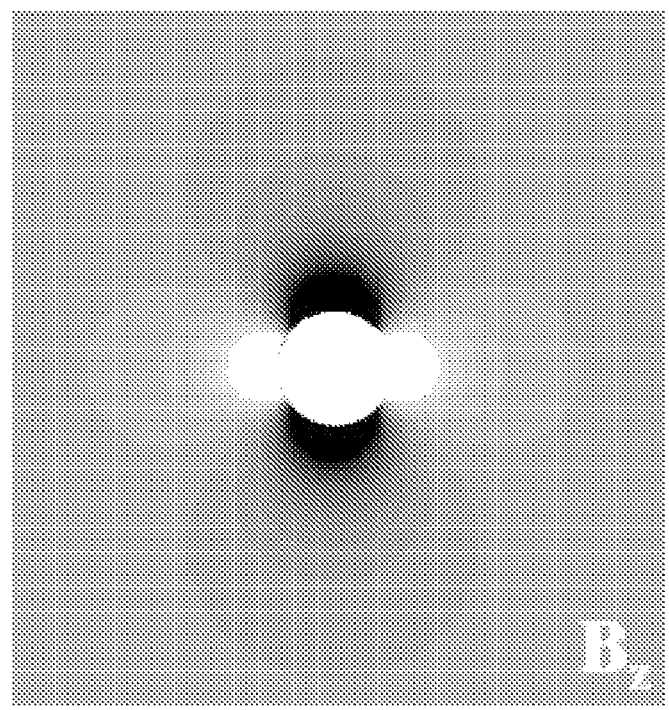
FIG. 1 shows an expected magnetic field pattern around a group of superparamagnetic iron-oxide (SPIO) nanoparticles.

SPIO nanoparticles enable visualization of labeled cells using MRI. The expected magnetic field pattern around a group of SPIO nanoparticles is shown in FIG. 1. This field variation leads to signal dephasing, resulting in signal voids that may be used as a means of detection. Thus, when used with standard imaging sequences, the particles act as a negative contrast agent. However, negative contrast agents cannot be distinguished from voids in the image and can suffer from partial volume effects. To avoid these errors, several techniques have been proposed for positive contrast imaging of SPIO-labeled cells. One of these techniques uses spectrally selective pulses to image off-resonant water near the labeled cells. Although these spectrally selective pulses enable flexible selection of the excited frequency range, they are not slice-selective, resulting in interfering background signal. The SPSP self-refocused pulse, provided by an embodiment of the invention, enables slice-selective imaging of off-resonant frequencies, hence eliminating background signal from sources of off-resonance outside the slice of interest.

Method:

Self-Refocused Pulse Design

In an embodiment of the invention a minimum-phase 180° pulse with a bandwidth (BW) of 164 Hz was designed using the Shinnar Le-Roux (SLR) algorithm. Using this algorithm, each RF pulse can be described by a pair of complex polynomials ($\beta(k_z,k_\omega)$, $\alpha(k_z,k_\omega)$) or just ($\beta$, $\alpha$). A minimum-phase 180° pulse was used in order to minimize the echo time for the final self-refocused pulse.

If $\beta_{180}(z, \omega)$ and $\alpha_{180}(z, \omega)$ are the transforms of the polynomials for the minimum phase 180° pulse, then $\beta_{final}(z, \omega)$ and $\alpha_{final}(z, \omega)$ for the self-refocused pulse are given by Equations 1 and 2.

$$\beta_{final}(z, \omega) = \frac{1}{\sqrt{2}}\beta_{180}(z, \omega) \quad [1]$$

and $$\alpha_{final}(z, \omega) = \alpha_{180}(z, \omega)\varepsilon^{-1} - \frac{1}{\sqrt{2}}\beta_{180}(z, \omega)e^{i\phi} \quad [2]$$

where $\phi$ is echo phase. The parameter $\varepsilon^{-1}$ is the echo delay given by equation 3.

$$\varepsilon = e^{i\gamma G_x(\Delta T)} \quad [3]$$

where $\Delta T$ is the time between the end of the pulse and the occurrence of the spin echo.

The general form of the expression for the final spectral profile of the self-refocused pulse given in terms of the transforms of the $\beta$ and $\alpha$ polynomials is given by:

$$S(z,\omega) = 2\alpha_{final}(z,\omega) * \beta_{final}(z,\omega) \quad [4]$$

$\Delta T$ can be set to any value greater than or equal to zero. For this design, a $\Delta T$ of 5.8 ms was sufficient to leave room for the phase encoding and readout gradients. Because the self-refocused approximation incorporates a pair of phase-matched pulses into a single pulse, the final echo is has linear phase. However, merging the pulse pair into a single pulse leaves no room for crushers. Consequently, acquisitions from two different self-refocused pulses are required: pulse 1, with the echo phase $\phi=0$ and pulse 2 with $\phi=180°$. If the profile of pulse 2 is subtracted from the profile of pulse 1, the component that is not refocused is eliminated. This gain in SNR is equivalent to that obtained with using two averages. The final spectral profile is given by equation 5.

$$S(z,\omega) = 2\alpha_1(z,\omega) * \beta_1(z,\omega) - 2\alpha_2(z,\omega) * \beta_2(z,\omega) \quad [5]$$

Making the Self-Refocused Pulse into a Spatial-Spectral Pulse

Figure 2A:
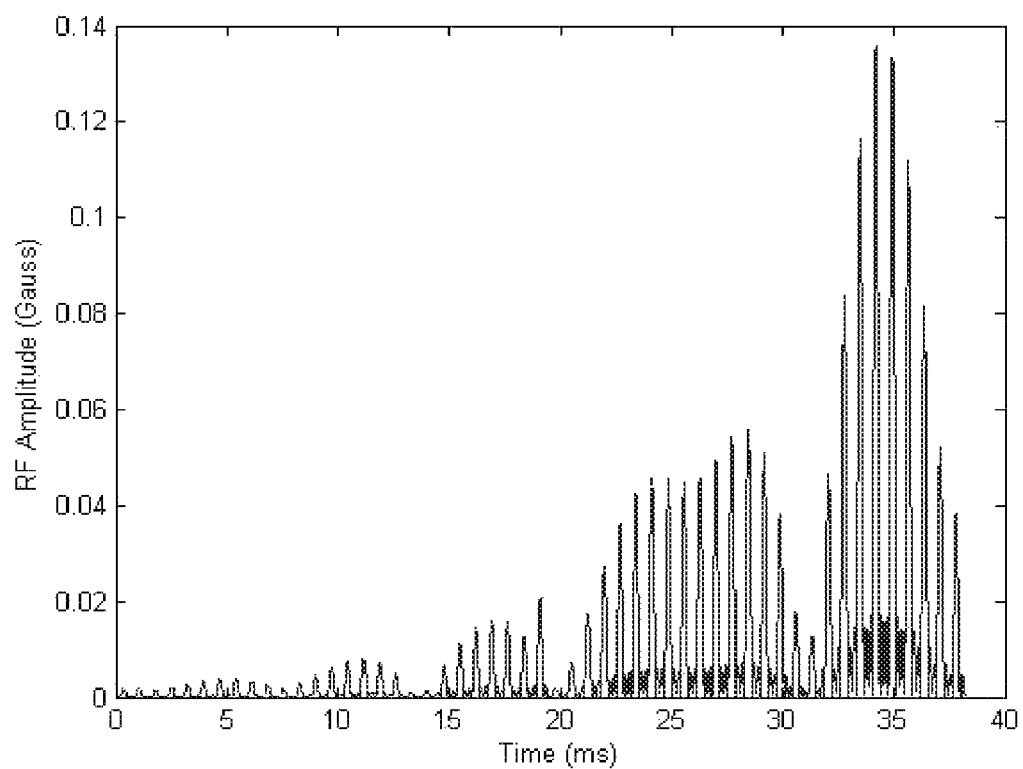
FIGS. 2A-D show the magnitude, spectral profile, spatial profile, and 2D spatial-spectral profile of a self-refocused pulse pair.

The self-refocused pulses 1 and 2 were subsampled with 53 samples based on an optimal trade off between sideband distance and minimum slice thickness. The final self-refocused SPSP pulses were comprised of 53 conventional small tip-angle subpulses scaled by the sampled values of the self-refocused pulse envelopes. The spectral sidebands had to be placed at a sufficient distance away from the main passband to prevent erroneous excitation of off-resonant signal from air or fat. Clearly, it would be desirable to have the sidebands as far out as possible, but increased sideband spacing required shorter subpulse duration and hence faster gradient refocusing for the same slice thickness. Thus, sideband spacing was limited by available gradient amplitude and slew rates. The final pulse duration was 38 ms, and the resultant spatial bandwidth was 4937 Hz. The separation between the main passband and sidebands of the spectral profile was +/−1.39 kHz. The opposing sidebands were located at +/−695 Hz. FIG. 2A shows the magnitude of each self-refocused SPSP RF pulse. The pulses are played in conjunction with an oscillating gradient waveform. Although the pulse duration is long, most of the energy is concentrated towards the end of the pulse, resulting in an echo time of 10 ms.

Figure 2B:
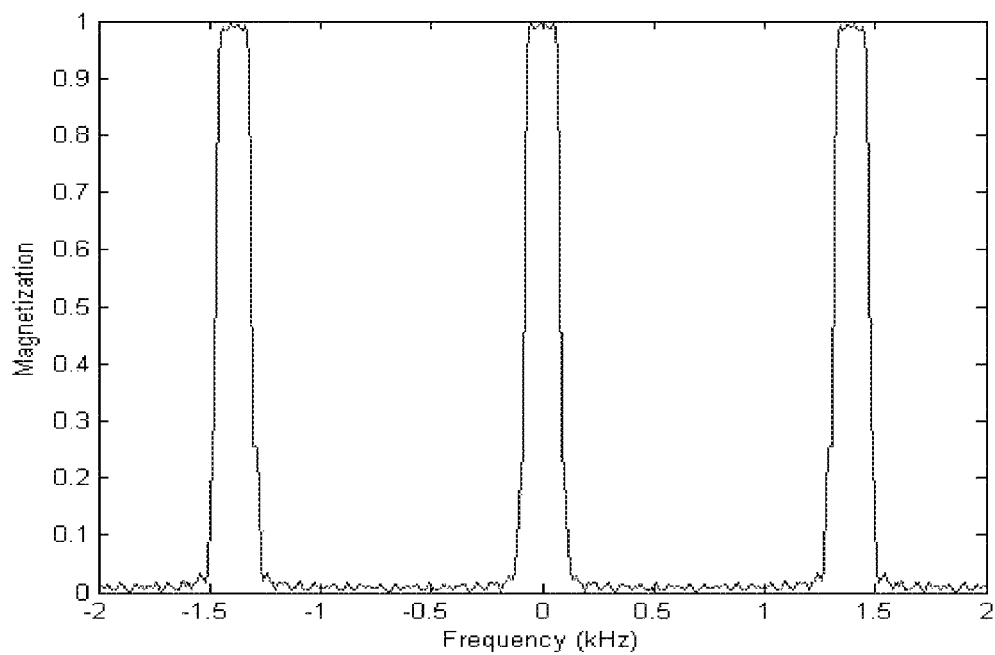
Figure 2C:
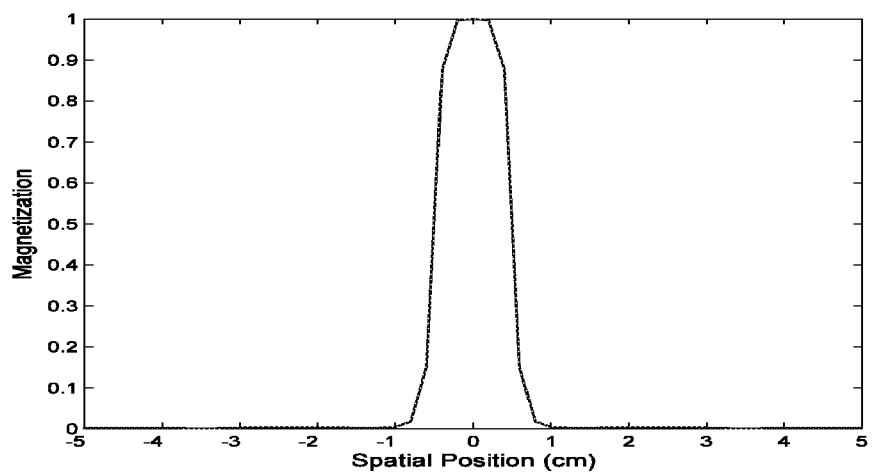
Figure 2D:
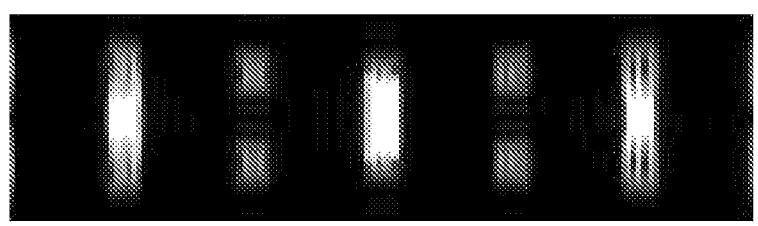

The final spectral profile obtained after subtracting the profiles of pulses 1 and 2 is plotted in FIG. 2B and shows the main passband and sidebands at +/−1.39 kHz. FIG. 2C is the spatial profile. Simultaneous spatial and spectral selectivity as well as the chemical shift immunity of the pulse profile is demonstrated in the simulated 2D spatial-spectral profile, FIG. 2D. In the final implementation, the transmit frequency of the pulses is shifted off-center to allow positive contrast imaging. Although in this example, the spectral bandwidth is 164 Hz with a 1.39 kHz frequency separation between the main passband and sidebands, these and other pulse parameters may be varied to optimize the performance of the pulse for the specific application.

Final Sequence

Figure 3A:
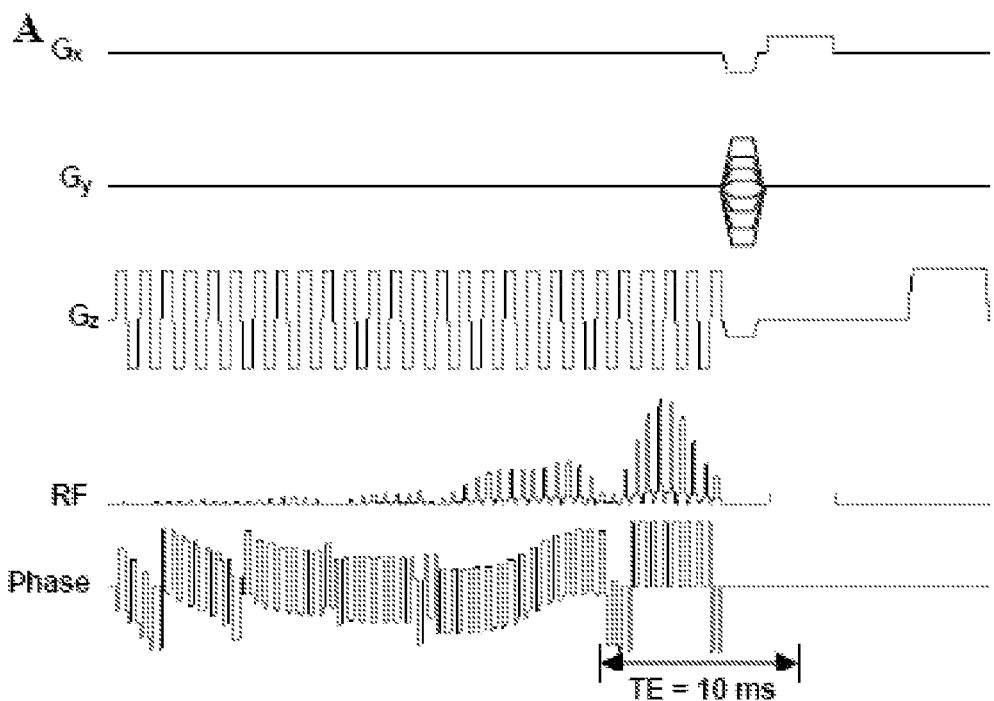
FIGS. 3A-B show RF phase, and gradient waveforms for the pulse sequence used for first acquisition and second acquisition using a self-refocused SPSP pulse pair.
Figure 3B:
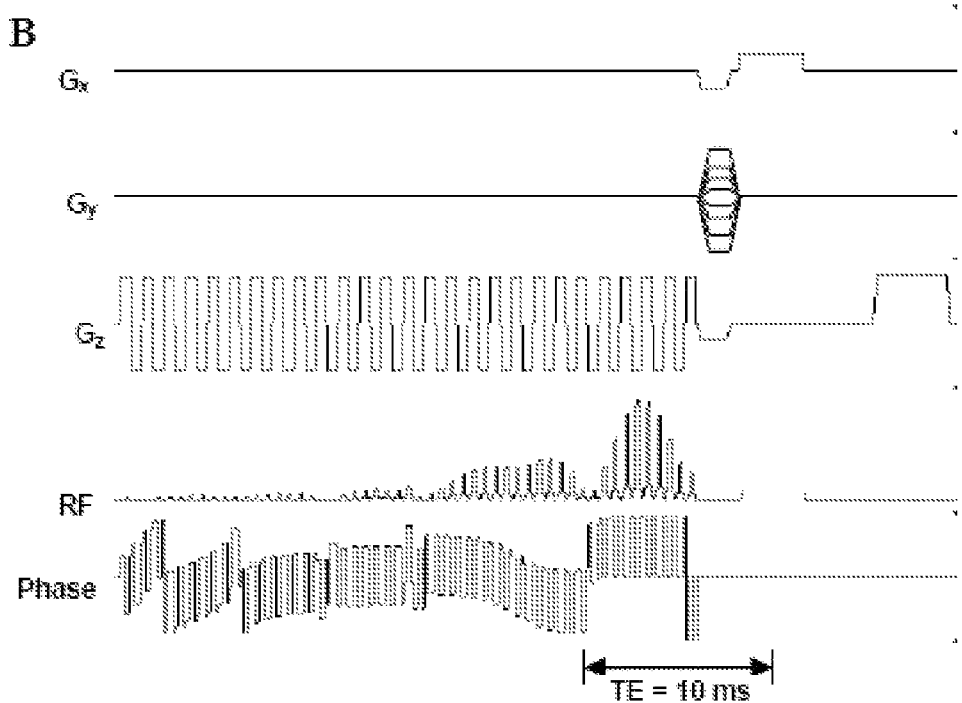

FIGS. 3A-B show the RF amplitude, phase and gradient waveforms for the sequences which utilize version 1 (FIG. 3A) and 2 (FIG. 3B) of the self-refocused SPSP pulse to create a spin echo. RF amplitude waveforms are identical for the two pulses; however, the phase waveforms differ. For a 38 ms pulse, 1.7 ms phase encode and 4 ms readout gradient, a minimum echo time (TE) of 10 ms can be achieved. The transmit frequency of the pulses is offset by 450 Hz to acquire signal from off-resonant spins in the vicinity of the SPIO nanoparticles.

Results:

Phantom Results

Data were obtained from an agar phantom with varying concentrations of SPIO-labeled human stromal cells. Scans were performed with a standard birdcage head coil at 1.5 T (Echospeed whole-body magnet; GE Healthcare, Waukesha, Wis., USA). A 6 mm slice was acquired using the sequences in FIGS. 3A-B and the final subtracted image was compared to that obtained with a GRE sequence. Acquisition parameters were: TE/TR=10/800 ms and matrix size=256×128. The spectral profile was shifted by +450 Hz.

Figure 4A:
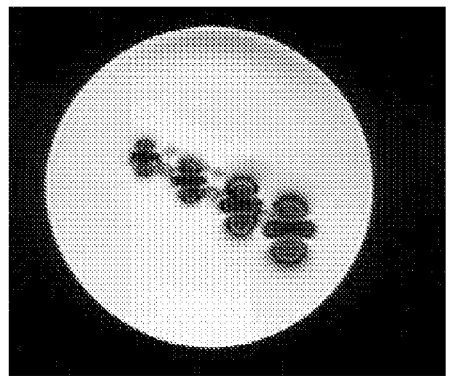
FIGS. 4A-C show a GRE image of a phantom, positive contrast image of the phantom obtained using the self-refocused pulse pair, and labeled cell concentrations in the phantom.
Figure 4B:
Figure 4C:
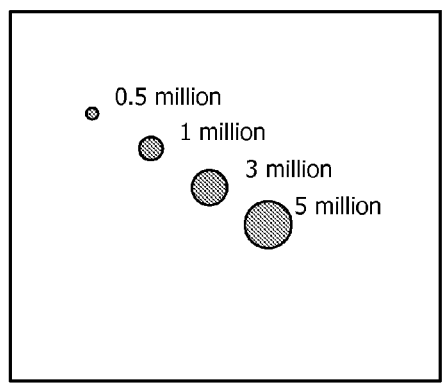

FIG. 4A shows the image obtained using a standard GRE sequence with varying concentrations of SPIO-labeled cells and FIG. 4B shows the positive-contrast image of the same slice obtained using the self-refocused SPSP spin-echo sequence. SPIO-labeled cell concentrations are given in FIG. 4C. There is minimal spatial misregistration between the signal voids in the GRE image and the bright signals in the self-refocused SPSP spin-echo image.

In Vivo Results

Figure 5A:
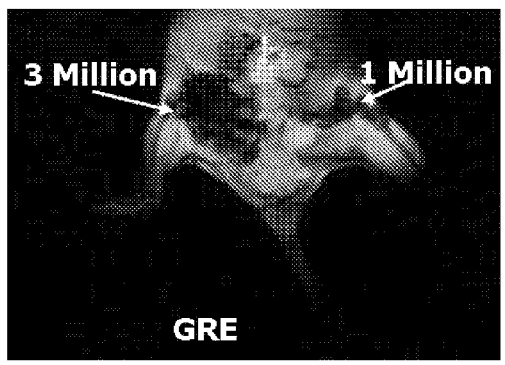
FIGS. 5A-B show an in vivo GRE image and positive contrast image obtained using a self-refocused pulse pair.
Figure 5B:
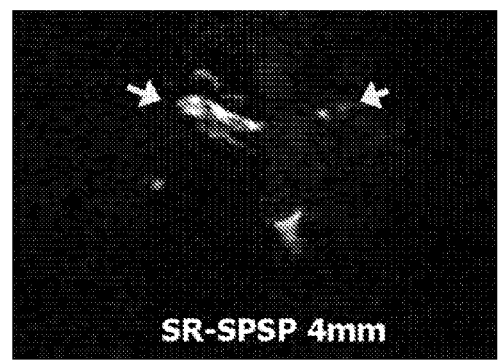

In vivo data were obtained from a mouse, with 1 million and 3 million SPIO-labeled cells injected into the hind legs. Scans were performed at 1.5 T (Echospeed whole-body magnet; GE Healthcare, Waukesha, Wis., USA) with a standard 3-inch surface coil. Acquisition parameters were: slice thickness=4 mm, TE/TR=10/400 ms and matrix size=256×128. The spectral profile was shifted by −450 Hz (by shifting the transmit frequency) to exclude the fat resonance from the sidebands or opposing sidebands. FIG. 5A shows the image obtained using a standard GRE sequence with 1 million and 3 million SPIO-labeled cells injected into hind legs, and FIG. 5B shows the positive-contrast image obtained using the self-refocused SPSP spin-echo sequence. Cell concentrations are labeled on the images.

DISCUSSION

Phantom and in vivo data demonstrate that the self-refocused SPSP pulse is successful in creating positive contrast images of SPIO-labeled cells for a selected slice. Similar positive-contrast images may be created using a pair of spectrally selective 90° and 180° pulse; however, the lack of spatial selectivity results in background artifacts. Changing the 90° and 180° pulses into spatial-spectral pulses provides slice selectivity but only at the expense of significantly lengthening the minimum TE. The self-refocused spin-echo SPSP pulse developed in this work provides slice selectivity with much shorter echo times. If insert gradients with higher amplitude and slew rate limits are used, much thinner slices may be achieved. This new RF pulse design improves non-invasive visualization of labeled cells and therefore has significant research value.

Generic Embodiment

Figure 6:
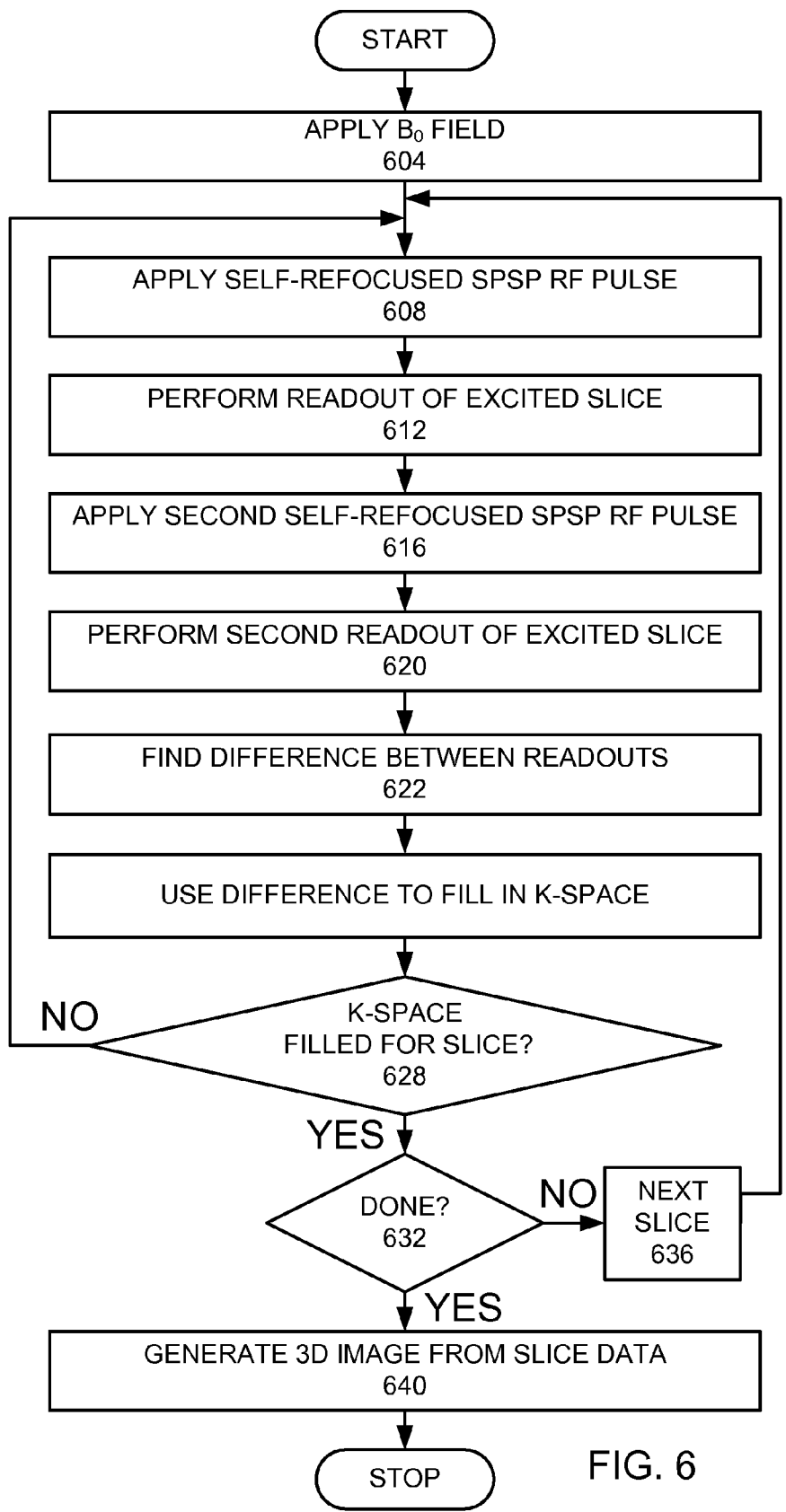
FIG. 6 is a high level flow chart of an embodiment of the invention.

FIG. 6 is a high level flow chart of a generalized embodiment of the invention. A $B_0$ field is applied (step 604). A self-refocused spatial-spectral (SPSP) excitation pulse is applied for a selected slice (step 608). Such a pulse is technically an excitation pulse and a refocusing pulse in one pulse, but in the application and claims may be referred to as an excitation pulse, although technically it is not just an excitation pulse. Preferably, in one embodiment the self-refocused SPSP RF excitation pulse is a single pulse approximation of a pulse pair. In another embodiment the excitation pulse is two separate phase-matched pulses that produce a linear-phase spin-echo. Another embodiment may provide an intermediate pulse combination between the previous two embodiments. A readout is performed for a portion of k-space for the selected slice (step 612). A second self-refocused SPSP RF excitation pulse is applied (step 616). Preferably, the second self-refocused SPSP RF excitation pulse is a single pulse approximation of a pulse pair, but may have the same alternatives as the self-refocused spatial spectral excitation. Preferably, the self-refocused SPSP RF pulse and the second self-refocused SPSP RF pulse have substantially equal amplitude waveforms and different phase waveforms. More preferably, the self-refocused SPSP RF pulse and the second self-refocused SPSP RF pulse have a 180° echo phase difference. A second readout for a portion of k-space is performed for the selected slice (step 620).

The difference between the first readout and the second readout is found, to remove unrefocused components of the magnetization (step 622). The difference is used to provide a portion of k-space. This difference is determined for each acquisition (i.e. before all of k-space has been read out) in this embodiment. In another embodiment this difference is determined after all of k-space has been filled, as long as values for the same k-space locations are being subtracted from each other for readouts from the two pulses. For each TR, a slice is excited and signal corresponding to particular spatial frequencies is read out and assigned to those spatial frequencies or "k-space locations." The locations of k-space that will be read out are dependent on the readout trajectory.

If k-space is not filled for the selected slice (step 628), the process returns to step 608 to repeat the process until k-space is filled for the selected slice. When the k-space for the selected slice is filled a determination is made if the desired volume has been readout (step 632). If the desired volume has not been read out, then another slice is selected (step 636) and the process returns to step 608. When the desired volume has been readout, a 3D image is generated from the multiple slice data (step 640). In various embodiments of the invention, these pulses could be used for any readout trajectory. They could also be used for a 2D or 3D experiment. Since these pulses are only used for excitation, they can be combined with any form of readout. As long as corresponding k space values obtained by the two pulses with a 180 degree difference in echo-phase are subtracted. In a 2D process, thin slices may be used. In a 3D process thicker slices, sometimes called slabs, may be used. In the specification and claims the generic use of "slice" may be used to also cover thicker slabs.

Figure 7:
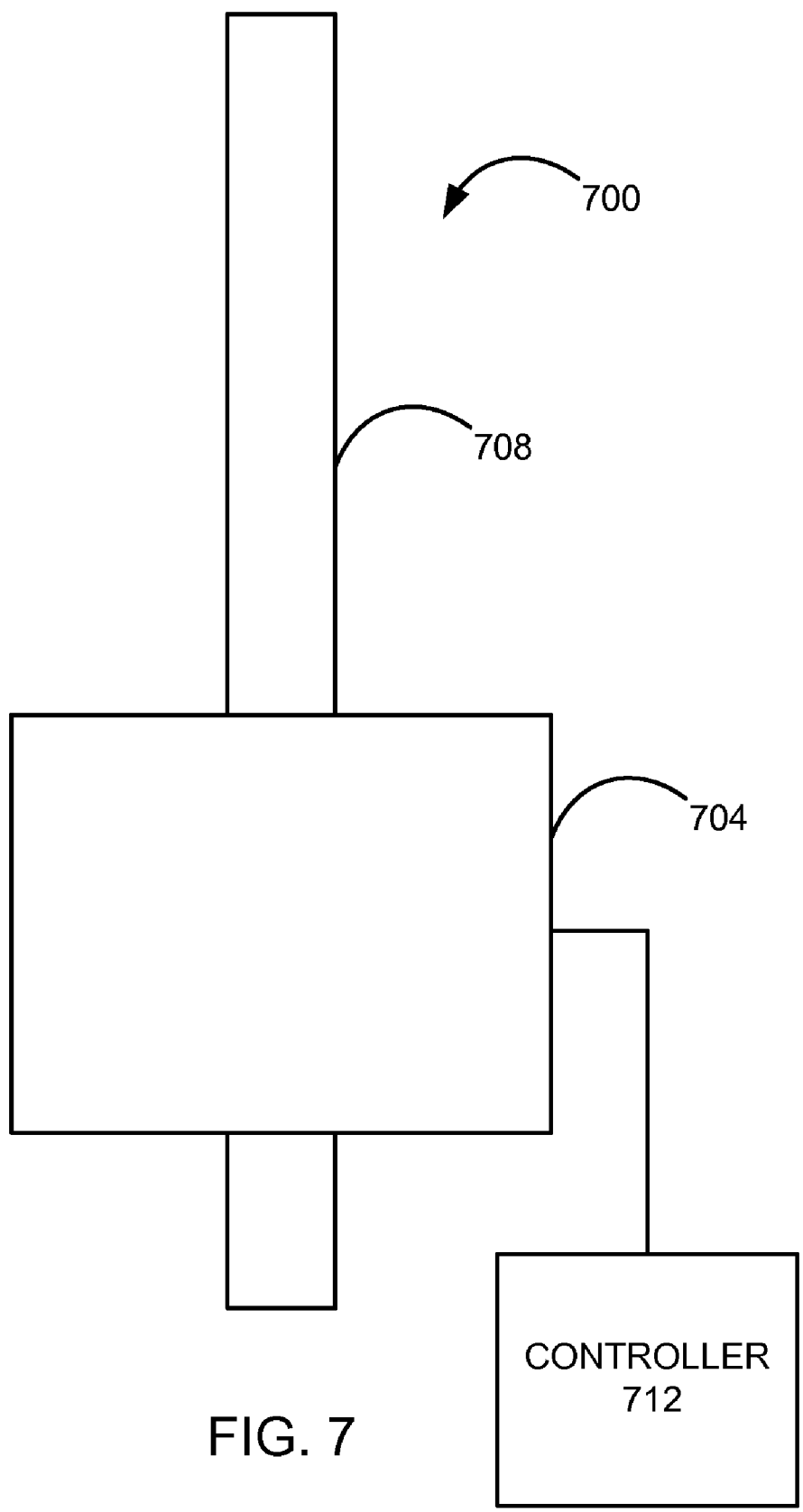
FIG. 7 is a schematic top view of a magnetic resonance imaging (MRI) system.

FIG. 7 is a schematic top view of a magnetic resonance imaging (MRI) system 700 that may be used in an embodiment of the invention. The MRI system 700 comprises a magnet system 704, a patient transport table 708 connected to the magnet system, and a controller 712 controllably connected to the magnet system. In one example, a patient would lie on the patient transport table 708 and the magnet system 704 would pass around the patient. The controller 712 would control magnetic fields and radio frequency (RF) signals provided by the magnet system 704 and would receive signals from detectors in the magnet system 704.

Figure 8A:
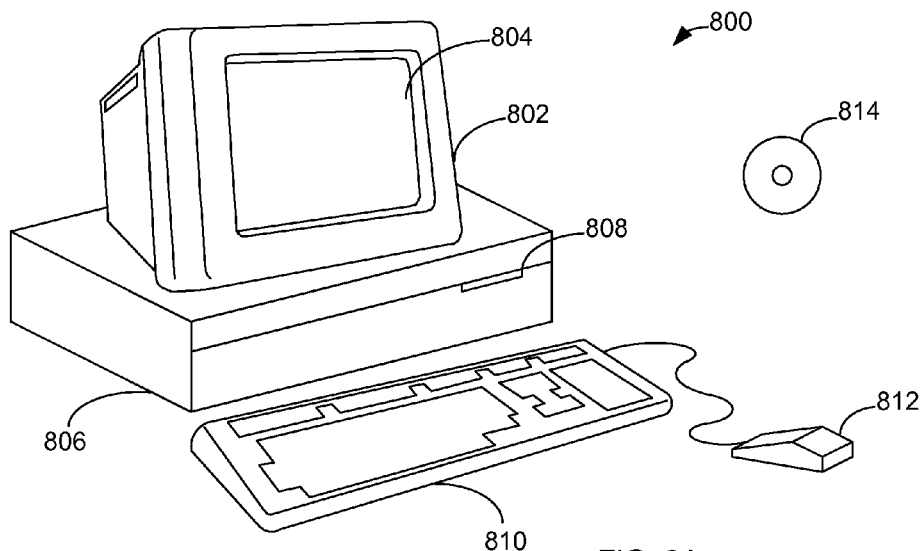
FIGS. 8A and 8B illustrate a computer system, which is suitable for implementing a controller used in embodiments of the present invention.
Figure 8B:
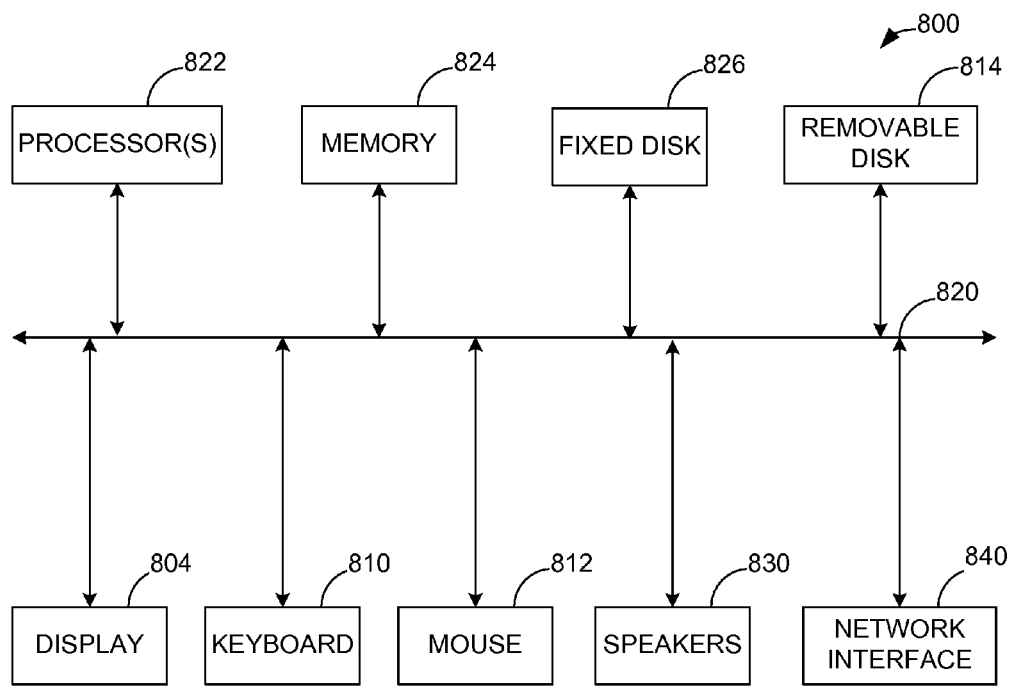

FIGS. 8A and 8B illustrate a computer system 800, which is suitable for implementing a controller 712 used in embodiments of the present invention. FIG. 8A shows one possible physical form of the computer system. Of course, the computer system may have many physical forms ranging from an integrated circuit, a printed circuit board, and a small hand-held device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: tangible computer readable media, such as magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be intangible computer readable media, such as computer code transmitted by a computer data signal embodied in a carrier wave and representing a sequence of instructions that are executable by a processor.

Preferably, the number of subsamples of each pulse is between 10 and 100. More preferably, the number of subsamples of each pulse is between 20 and 80.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for frequency selective and slice selective magnetic resonance imaging (MRI), comprising:
    a) applying a $B_0$ field;
    b) applying a self-refocused spatial-spectral (SPSP) RF pulse; and
    c) performing a readout of a portion of k-space for the excited slice.

2. The method as recited in claim 1, further comprising:
    d) applying a second self-refocused SPSP RF pulse;
    e) performing a second readout of a portion of k-space for the excited slice;
    f) repeating steps b to e until k-space has been filled for the excited slice; and
    g) repeating steps b-f for a plurality of slices.

3. The method as recited in claim 2, further comprising finding a difference between the readout and the second readout after performing the second readout.

4. The method as recited in claim 3, wherein the second self-refocused SPSP pulse has a 180° echo phase difference from the self-refocused SPSP pulse.

5. The method as recited in claim 4, wherein the self refocused SPSP pulse produces a spin echo with an echo time, wherein the echo time may be adjusted by changing a delay parameter in a pulse design.

6. The method as recited in claim 5, wherein a final phase profile of the spin echo produced by the self-refocused SPSP pulse is linear.

7. The method of claim 6, wherein the self-refocused SPSP RF pulse and the second self-refocused SPSP RF pulse have substantially equal amplitude waveforms and different phase waveforms.

8. The method of claim 7, wherein the self-refocused SPSP RF pulse is a pulse pair incorporated into a single pulse.

9. The method of claim 8, further comprising adding superparamagnetic iron oxide (SPIO) nanoparticles to an object being imaged.

10. The method of claim 9, further comprising using the self-refocused SPSP pulse for positive-contrast, slice-selective imaging of the SPIO's.

11. The method, as recited in claim 3, wherein the difference is found for each acquisition after step e and before step f.

12. The method, as recited in claim 3, wherein the difference is found for each excited slice after step f, wherein values for the same k-space locations are being subtracted from each other for the readouts and second readouts.

13. The method of claim 1, wherein the self-refocused SPSP RF pulse is created from an arbitrary 180° pulse and a 90° pulse that is matched in phase to the 180° pulse and used in an approximation to create a final self-refocused pulse, which produces an echo that has linear phase.

14. The method of claim 1, wherein the self-refocused SPSP RF pulse is a match-phase SPSP RF pulse pair incorporated into a single pulse through a series of approximations.

15. The method as recited in claim 1, wherein the self refocused SPSP pulse produces a spin echo with an echo time, wherein the echo time may be adjusted by changing a delay parameter in a pulse design.

16. The method as recited in claim 1, wherein the final phase profile of the spin echo produced by the self-refocused SPSP pulse is linear.

17. A method for frequency selective and slice selective magnetic resonance imaging (MRI), comprising:
    a) applying a $B_0$ field;
    b) applying a self-refocused spatial-spectral (SPSP) RF pulse;
    c) performing a readout of a portion of k-space for the excited slice;
    d) applying a second self-refocused SPSP RF pulse, wherein the second self-refocused SPSP pulse has a 180° echo phase difference from the self-refocused SPSP pulse;
    e) performing a second readout of a portion of k-space for the excited slice;
    f) finding a difference between the readout and the second readout;
    g) repeating steps b to f until k-space has been filled for the excited slice; and
    h) repeating steps b to g for a plurality of slices.

18. An apparatus for frequency selective and slice selective magnetic resonance imaging (MRI), comprising:
    a magnetic resonance imaging excitation and detection system; and
    a controller electrically connected to the magnetic resonance imaging excitation and detection system, comprising:
        a display;
        at least one processor; and
        computer readable media, comprising:
            computer readable code for applying a $B_0$ field;
            computer readable code for applying a self-refocused spatial-spectral (SPSP) RF pulse;

computer readable code performing a readout of a portion of k-space for the excited slice;

computer readable code for generating an image from the readout; and computer readable code for displaying the image on the display.

19. The apparatus, as recited in claim 18, wherein the computer readable media, further comprises:

computer readable code for applying a second self-refocused SPSP RF pulse;

computer readable code for performing a second readout of a portion of k-space for the excited slice; and computer readable code for finding a difference between the readout and the second readout, wherein the generating the image uses the found difference.

* * * * *